FREQUENCY MODULATOR HAVING VOLTAGE VARIABLE CAPACITANCE MEANS

Filed March 26, 1963

INVENTOR.

THEODORE R. TRILLING

BY [signature]

ATTORNEY 3,249,897

FREQUENCY MODULATOR HAVING VOLTAGE VARIABLE CAPACITANCE MEANS

Theodore R. Trilling, Levittown, Pa., assignor to the United States of America as represented by the Secretary of the Navy Filed Mar. 26, 1963, Ser. No. 268,164
1 Claim. (Cl. 332—18)

The invention herein described may be manufactured and used by or for the Government of the United States of America for governmental purposes without the payment of any royalties thereon or therefor.

This invention relates to a modulator and particularly to a frequency modulator which is linear over extremely wide ranges of frequency with respect to the carrier frequency.

Most frequency modulators available today use some form of non-linear compensation to eliminate to a limited degree non-linearity for the purpose of extending linear operations beyond that which the frequency modulator normally operates. These modulators may be voltage variable capacitor or voltage variable multivibrator types with compensation being provided by diode compensation networks. The diode compensation networks are used to approximate the inverse of the non-linear modulation curve by taking small straight line segments thereof. Thus, in order to provide linear operation throughout moderate changes in frequency a plurality of these diode compensation networks are required for effectively adding a large number of these straight line segments. Each one of these circuits requires at least a diode with voltage source and a resistor. Also, each network to be effective must be compensated for changes in temperature by use of additional electronic components.

The present invention contemplates a frequency modulator which is capable of linear operation within an unusually wide range of frequencies relative to the carrier frequency which comprises two voltage controlled oscillators each of which utilizes a diode-type variable capacitor or other non-linear voltage controlled device. The input to the voltage controlled oscillators is split in phase so that the two oscillators are driven by opposite phase voltages to produce output frequencies which are beat to produce an output frequency which is linear over extremely wide ranges with the linearity being unaffected to a much lesser degree by changes in ambient temperature.

Therefore, it is an object of the present invention to provide a frequency modulator capable of linear operation over an extremely wide range of frequencies relative to the carrier frequency.

Another object of the present invention is to provide a frequency modulator wherein first distortion term normally present in the output frequency is eliminated.

It is another object of the present invention to provide a frequency modulator wherein the output frequencies of two voltage controlled oscillators which are driven out of phase are mixed by which first distortion frequency components are eliminated from the difference signal.

A further object of the present invention is to provide a frequency modulator having less than 4% distortion in its output signal at 100% deviation from the carrier frequency.

Still another object of the present invention is to provide a frequency modulator which is linear in operation within a wide frequency range relative to the carrier frequency regardless of changes in temperature.

Other objects and many of the attendant advantages of this invention will be readily appreciated as the same becomes better understood by reference to the following detailed description when considered in connection with the accompanying drawing in which like reference numerals designate like parts throughout the figures thereof and wherein.

Figure 1:
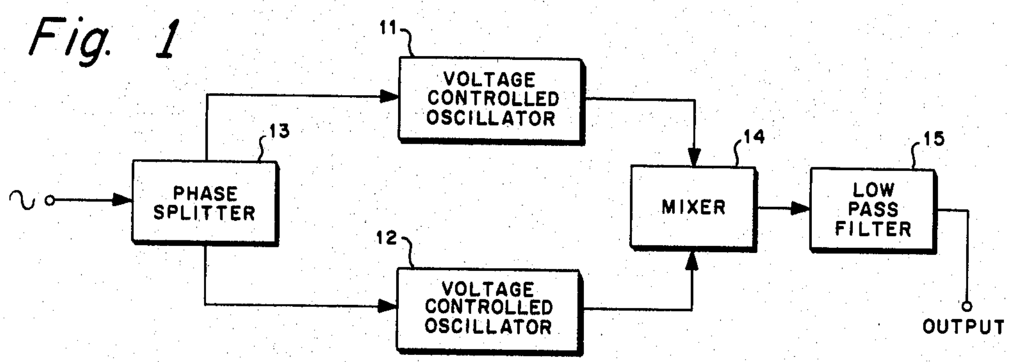
FIG. 1 illustrates in block diagram form an embodiment of the present invention.

Referring now more particularly to FIG. 1, there is shown a frequency modulator of the present invention comprising voltage controlled oscillator 11 and voltage controlled oscillator 12. The inputs of voltage controlled oscillators 11 and 12 are connected to phase splitter 13. The outputs of voltage controlled oscillators 11 and 12 are connected to mixer 14. The output of mixer 14 is connected to low pass filter 15.

The signal to be modulated is fed to the input of phase splitter 13 which provides two outputs identical to the input except that each output is 180 degrees out of phase with the other. Thus, the two voltage controlled oscillators 11 and 12 are driven out of phase relative to each other and provide an input to mixer 14 wherein they are beat to produce a difference signal. This technique provides out of the mixer 14 a difference signal in which the normally present first distortion term has been eliminated.

In a typical voltage controlled oscillator utilizing a varicap or voltage variable capacitance type diode, as the voltage responsive device for varying frequency, it can be shown that:

$$(1)\quad f_{(v)}=f_0\left[1+\frac{1}{4}\frac{\Delta V}{V_0}-\frac{3}{32}\left(\frac{\Delta V}{V_0}\right)^2+\frac{21}{384}\left(\frac{\Delta V}{V_0}\right)^3+\text{negligible terms}\right]$$

where:

$V_0$ is the voltage across the voltage variable tank capacitor at $f_0$;

$f_0$ is the tuned carrier frequency; or $$f_0=\frac{V_0^{1/4}}{2\pi\sqrt{KL}}$$

$\Delta V$ is the change in voltage from $V_0$;

L is the inductance of the oscillator; and

K is a constant.

Equation 1 is the normalized frequency equation of a voltage controlled oscillator. From Equation 1 the normalized change in frequency from the carrier frequency $f_0$ may be written in Taylor series as:

$$(2)\quad \Delta f=f_0\left[\frac{1}{4}\frac{\Delta V}{V_0}-\frac{3}{32}\left(\frac{\Delta V^2}{V_0}\right)^2+\frac{21}{384}\left(\frac{\Delta V}{V_0}\right)^3+\text{negligible terms}\right]$$

In Equation 2 the first distortion term is $$-\frac{3}{32}\left(\frac{\Delta V}{V_0}\right)^2$$

This term may be written as the ratio of the second term to the first term in the series:

$$\frac{-\frac{3}{32}\left(\frac{\Delta V}{V_0}\right)^2}{\frac{1}{4}\frac{\Delta V}{V_0}}=0.375\frac{\Delta V}{V_0}$$

From the above it can readily be seen that in a voltage controlled oscillator where the deviation $\Delta f$ of frequency from the carrier frequency $f_0$ is only 10% the distortion due to the first term is 3.75%. Where the deviation $\Delta f$ of frequency from the carrier frequency is 100%, that is where $\Delta f=f_0$ the distortion is 37.5%.

By a similar analysis it can be shown that distortion due to the second distortion term $$\frac{21}{384}\left(\frac{\Delta V}{V_0}\right)^3$$

is 21.9% at 100% deviation and 0.219% at 10% deviation. Thus, even where there is only 10% deviation of the carrier frequency, the distortion is high. However, if two voltage controlled oscillators are driven by opposite phase voltages and the outputs thereof are mixed, distortion may be virtually eliminated.

Since the outputs from voltage controlled oscillators 11 and 12 are nearly equal in frequency and are mixed in nonlinear mixer 14, the lowest frequency term is the difference between the two frequencies or:

$$f=g(f_2-f_1)$$

In normalized form these frequencies are given by:

$$f_{2(v)}=f_0\left[1+\frac{1}{4}\frac{V_2}{V_0}-\frac{3}{32}\left(\frac{\Delta V_2}{V_0}\right)^2+\frac{21}{384}\left(\frac{\Delta V_2}{V_0}\right)^3 + \text{negligible terms}\right]$$

$$f_{1(v)}=f_0\left[1\frac{1}{4}\frac{V_1}{V_0}-\frac{3}{32}\left(\frac{\Delta V_1}{V_0}\right)^2+\frac{21}{384}\left(\frac{\Delta V_1}{V_0}\right)^3 + \text{negligible terms}\right]$$

where $$V_1=V_0+\Delta V$$

and $$V_2=V_0-\Delta V$$

Substituting these equations into Equation 1 the following expression is obtained:

$$(3)\quad f^1(v_1, v_2)=\left[\frac{1}{4}\frac{\Delta V_2-\Delta V_1}{V_0}-\frac{3}{32}\frac{\Delta V_2^2-\Delta V_1^2}{V_0}+\frac{21}{384}\frac{\Delta V_2^3-\Delta V_1^3}{V_0^3}+\text{negligible terms}\right]$$

However, since the two voltage controlled oscillators 11 and 12 are driven by equal voltages of opposite phase $\Delta V_1=-\Delta V_2=\Delta V$. By substituting these equations into Equation 3 the following expression is obtained.

$$(4)\quad f^1{}_{(v)}=2f_0\left[\frac{1}{4}\frac{\Delta V^1}{V_0}+\frac{21}{384}\left(\frac{\Delta V^1}{V_0}\right)^3+\text{negligible odd powered terms}\right]$$

where $$2\Delta V=\Delta V_2-V\Delta_1$$

For the situation where the carrier frequency deviation is made equal 10% of the carrier frequency $f_0$ equals $\frac{1}{5}V_0$ (neglecting the distortion terms) or $\Delta V=\frac{1}{5}V_0$ $$\frac{f_0^1}{f_0}=\frac{1}{2}\left[\frac{1}{5}+\frac{21}{96}\left(\frac{1}{5}\right)^3\right]=\frac{1}{5}(1+.00875)$$

Thus, for 10% deviation of the carrier frequency, the distortion is 0.875% and $$\Delta V=\frac{V_{02}-V_{01}}{2}$$

where $V_{02}$ is the bias voltage of oscillator 12 and $V_{01}$ is the bias voltage of oscillator 11.

Having chosen a carrer frequency a dynamic distortion term may now be determined from Equation 4. In this case ΔV is composed of two terms $\Delta V_0$ (which is produced by biasing the two oscillators to $V_{02}$ and $V_{01}$) and δV which is the dynamic term representing the signal used to modulate the carrier. Equation 4 then becomes:

(5)

$$f^1(\Delta V_0, \delta V)=\frac{1}{2}f_0\left[\frac{\Delta V_0}{V_0}+\frac{\delta V}{V_0}+\frac{21}{96}\left(\frac{(\Delta V_0)^3}{V_0^3}+\frac{3\Delta V_0(\delta V)^2}{V_0^3}+\frac{(\delta V_0)^3}{V_0^3}\right)+\text{negligible odd powered terms}\right]$$

Since $$\frac{\Delta V_0+\delta V}{V_0}<1$$

and the coefficients in the expansion shown in Equation 5 contain a $1/n$ factorial, the higher power terms may be considered negligible. Since the frequency may be split into its carrier and dynamic components the dynamic equation becomes:

$$(6)\quad \frac{\delta f}{f_0}=\frac{1}{2}\left[\frac{\delta v}{V_0}+.219\,\frac{3(\Delta V_0)^2\delta V}{V_0^3}+.219\left(\frac{3\Delta V_0(\delta V)^2}{V_0^3}+\frac{(\delta V)^3}{V_0^3}\right)\right]$$

Since at 100% deviation or when $\delta V=\pm\Delta V_0$ distortion is worst, distortion is calculated for this condition.

In this case Equation 6 becomes:

$$(7)\quad \frac{\delta f}{f_0}=\frac{1}{2}\frac{\Delta V_0}{V_0}\left[1+.219\times 3\left(\frac{\Delta V_0}{V_0}\right)^2+.219\;4\left(\frac{\Delta V_0}{V_0}\right)^2\right]$$

When $\Delta V_0$ is taken as $\frac{1}{5}V_0$ Equation 7 reduces to:

$$\frac{\delta f}{f_0}=\frac{1}{10}\,[1+.2625+.027]$$

Thus when $\delta V=+\Delta V_0$ distortion is 2.63% and when $\delta V=-\Delta V_0$ distortion is 1.35. Maximum distortion at 100% deviation in either direction is then 3.98%. Thus, in the present invention it is possible to frequency modulate a carrier up to 100% deviation with extremely low distortion relative to other frequency modulators. At the same time the present invention allows frequency variation in a linear manner from D.C. up to any reasonable frequency.

Figure 2:
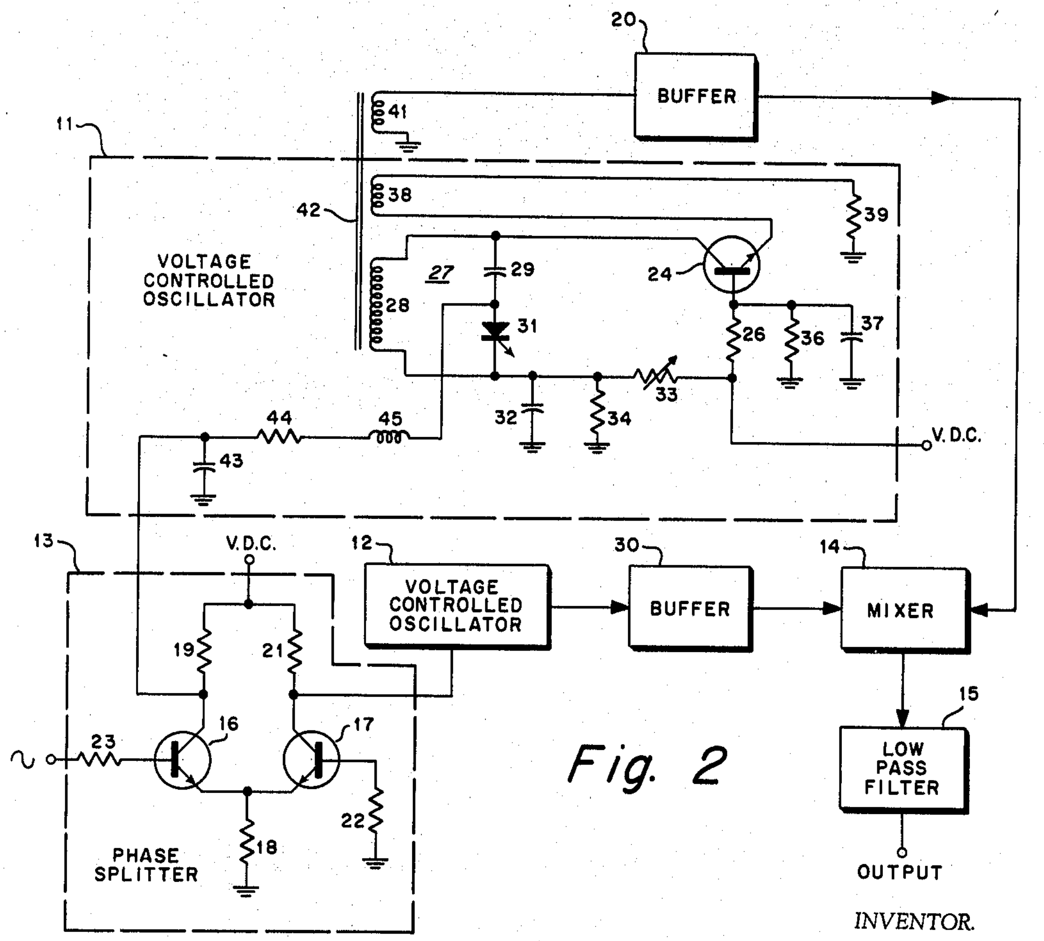
FIG. 2 illustrates partly in block diagram form and partly in schematic an embodiment of the present invention.

Referring now more particularly to FIG. 2, there is shown in more detail the frequency modulator of the present invention.

The phase splitter 13, as shown in FIG. 2, comprises transistors 16 and 17. The emitters of transistors 16 and 17 are connected through resistor 18 to ground. The collectors of transistors 16 and 17 are connected to a D.C. power supply through resistors 19 and 21, respectively. The base of transistor 17 is connected through resistor 22 to ground. The input to the phase splitter and the frequency modulator is connected or applied to the base of transistor 16 through resistor 23.

Voltage controlled oscillator 11 is connected to phase splitter 13 between the collector of transistor 16 and resistor 19. The input to voltage controlled oscillator 12 is connected to phase splitter 13 between the collector of transistor 17 and resistor 21.

When a signal which is to modulate the carrier frequency of the frequency modulator of the present invention is applied to the base of transistor 16 the voltage across the resistor 19 will always be 180 degrees out of phase with the voltage across resistor 21. In other words, as the voltage input increases the voltage across resistor 19 decreases, the voltage across resistor 18 increases, and the voltage across resistor 21 increases. When the voltage applied to the base of transistor 16 decreases, opposite states of conduction are produced. Thus, the output taken from between resistor 19 and the collector of transistor 16 will always be equal but opposite in phase from the output taken from the junction of the collector of transistor 17 and resistor 21.

Voltage controlled oscillator 11 which is identical to voltage controlled oscillator 12 is shown in detail in FIG. 2.

Voltage controlled oscillator 11 comprises a transistor 24 having its base connected to the D.C. voltage source through resistance 26. The collector of transistor 24 is connected to one side of tank circuit 27. Tank circuit 27 comprises coil 28 connected in parallel to the capacitance circuit comprising capacitor 29 and voltage variable capacitor or varicap 31 connected in series to capacitor 29. Varicap 31 is in effect a capacitor whose capacitance varies with storage. One side of tank circuit 27 is connected to ground through capacitor 32 as shown. Variable bias resistor 33 is connected between varicap 31 and resistor 26. Resistor 34 which connects one side of resistor 33 to ground forms a voltage divider with resistor 33. Bias resistor 33 is used to set the bias voltage of the tank circuit of the oscillator thereby tuning the oscillator to the desired frequency. The base of transistor 24 is connected to ground through resistance 36 and also through capacitor 37.

In order to obtain a beat frequency, voltage controlled oscillator 11 must be tuned for a frequency different from the frequency of voltage control oscillator 12. This is done by choosing a middle frequency and tuning one oscillator a predetermined amount above the middle frequency and the other oscillator the same predetermined amount below the middle frequency. For example, the oscillators may be tuned to provide a beat frequency from mixer 14 to 500 kc. which is the carrier frequency of the modulation.

The emitter of transistor 24 is connected to ground through coil 38 and resistor 39 as shown.

The output from oscillator 11 is picked up by coil 41 and is fed to mixer 14 through buffer circuit 20. As is shown, coils 28, 38 and 41 are inductively coupled through ferrite core 42. Buffer circuits 20 and 30 which may be thought of as being included in voltage controlled oscillators 11 and 12 in FIG. 1, are shown separately in FIG. 2.

The output from one side of phase splitter 13 is connected to oscillator 11 to a point between capacitor 29 and varicap 31 through a filter circuit comprising capacitor 43, resistor 44 and inductance 45. This filter circuit effectively prevents feedback of unwanted frequencies to the input and the other voltage controlled oscillator 12. The output from the other side of phase splitter 13 is fed to voltage controlled oscillator 12 which is identical in construction to voltage controlled oscillator 11.

As previously pointed out, the difference frequency output from mixer 14 is fed through low pass filter 15 to eliminate unwanted frequencies from the output. The output from low pass filter 15 is a modulated signal in which the first distortion term as determined from the Taylor series discussed above has been eliminated. The present invention provides a linear frequency modulator having less than 4% distortion that can be deviated up to ±100% of the carrier frequency.

Obviously many modifications and variations of the present invention are possible in the light of the above teachings. It is therefore to be understood that within the scope of the appended claim the invention may be practiced otherwise than as specifically described.

What is claimed is:

A frequency modulator providing linear modulation over a 100 percent range, comprising in combination:

first voltage controlled oscillator means operating at a first frequency;

second voltage controlled oscillator means operating at a second frequency;

a source of amplitude varying A.C. voltage;

phase splitter means connected between said source of A.C. voltage and said first and second voltage controlled oscillator means providing as inputs to said first and second voltage controlled oscillator means opposite phased frequencies of said amplitude varying A.C. voltage;

mixer means connected to said first and second voltage controlled oscillator means providing as an output a difference frequency which varies in proportion to the amplitude of said amplitude varying A.C. voltage;

each of said voltage controlled oscillator means comprising:

a transistor;

a tank circuit connected between the base and collector of said transistor;

an inductance coil linked to the emitter of said transistor;

an output inductance coil inductively linked in common to said emitter inductance coil and said tank circuit, said output inductance coil providing the output from said voltage controlled oscillator, and said tank circuit comprising:

a capacitor;

a voltage variable capacitance means in series with said capacitor;

and a tank inductance coil connected in parallel to said capacitor and said voltage variable capacitance means and providing the inductive linkage of said tank circuit with said output inductance coil.

References Cited by the Examiner

UNITED STATES PATENTS

| | | | |
|---|---|---|---|
| 2,182,377 | 12/1939 | Guanella. | |
| 2,735,983 | 2/1956 | McLeod | 332—23 X |
| 2,756,331 | 7/1956 | Foster et al. | 331—40 X |
| 3,068,427 | 12/1962 | Weinberg. | |
| 3,159,801 | 12/1964 | Wiedemann | 331—36 |

OTHER REFERENCES

Basic Theory and Application of Transistors, Dept. of the Army Technical Manual, TM11-690, March 1959, pages 171, 172, Figs. 165A, 167.

Phase Inverters and Feedback—Putman, Radio News, April 1942, page 21, Figure 4.

HERMAN KARL SAALBACH, *Primary Examiner.*

ALFRED L. BRODY, ELI LIEBERMAN, *Examiners.*

P. L. GENSLER, *Assistant Examiner.*